(12) United States Patent
V Katkoria

(10) Patent No.: US 12,345,775 B2
(45) Date of Patent: Jul. 1, 2025

(54) PLUGGABLE LOAD MODULE TO TEST A VOLTAGE REGULATOR

(71) Applicant: LOGIICDEV GMBH, Graz (AT)

(72) Inventor: Deepak V Katkoria, Graz (AT)

(73) Assignee: LOGIICDEV GMBH, Graz (AT)

( * ) Notice: Subject to any disclaimer, the term of this patent is extended or adjusted under 35 U.S.C. 154(b) by 0 days.

(21) Appl. No.: 18/874,977

(22) PCT Filed: Apr. 26, 2023

(86) PCT No.: PCT/AT2023/060138
§ 371 (c)(1),
(2) Date: Dec. 13, 2024

(87) PCT Pub. No.: WO2023/245214
PCT Pub. Date: Dec. 28, 2023

(65) Prior Publication Data
US 2025/0164575 A1  May 22, 2025

(30) Foreign Application Priority Data

Jun. 22, 2022 (AT) .............................. A 50446/2022

(51) Int. Cl.
*G01R 31/28* (2006.01)
*G01R 31/30* (2006.01)
(Continued)

(52) U.S. Cl.
CPC ......... *G01R 31/40* (2013.01); *G01R 31/2837* (2013.01); *G01R 31/3004* (2013.01); *G01R 31/31908* (2013.01); *G01R 31/3333* (2013.01)

(58) Field of Classification Search
CPC ......... G01R 31/26; G01R 31/40; H01L 22/00; H01L 31/04; H10K 71/70
See application file for complete search history.

(56) References Cited

U.S. PATENT DOCUMENTS 4,037,156 A    7/1977   Goujon et al.
6,324,042 B1  11/2001  Andrews
(Continued)

FOREIGN PATENT DOCUMENTS

| GB | 2482487 A | 2/2012 |
|---|---|---|
| JP | 2014-092859 A | 5/2014 |
| WO | 2011/161819 A1 | 12/2011 |

OTHER PUBLICATIONS

International Search Report and Written Opinion, mailed Jul. 10, 2023, from PCT App. No. PCT/AT2023/060138, 6 pages.

*Primary Examiner* — Tung X Nguyen
(74) *Attorney, Agent, or Firm* — Workman Nydegger

(57) ABSTRACT

A test device for testing the invariability of the output voltage of a voltage regulator with transient loads, and the test device includes a switch connected with a switch drain contact to an output contact of the voltage regulator and with a switch source contact to ground potential, where a load resistance is arranged within this path from the output contact to ground potential, a switch driver connected with a switch driver output contact via a gate resistance to a switch gate contact to change the switch into a connected state, where the voltage regulator is loaded with a variable drain-source resistance of the switch and the load resistor, and to change the switch into a disconnected state, where the voltage regulator is disconnected from the load resistor, and a feedback resistor connected between the switch source contact and an inverted input contact of the switch driver.

18 Claims, 4 Drawing Sheets

(51) Int. Cl.
*G01R 31/319* (2006.01)
*G01R 31/333* (2006.01)
*G01R 31/40* (2020.01)

(56) References Cited

U.S. PATENT DOCUMENTS

| | | | |
|---|---|---|---|
| 7,692,441 B2 * | 4/2010 | Matsumoto | G01R 31/31924 324/73.1 |
| 9,429,629 B1 | 8/2016 | Pitel et al. | |
| 2009/0187367 A1 | 7/2009 | Kao et al. | |
| 2013/0271165 A1 * | 10/2013 | Chen | G01R 27/08 324/713 |
| 2018/0284821 A1 * | 10/2018 | Sakaguchi | G05F 1/575 |

* cited by examiner

PLUGGABLE LOAD MODULE TO TEST A VOLTAGE REGULATOR

FIELD OF THE INVENTION

The present invention relates to a test device for testing the invariability of the output voltage of a voltage regulator with transient loads, which test device comprises:
- a switch connected with a switch drain contact to an output contact of the voltage regulator and with a switch source contact to ground potential, wherein a load resistance is arranged within this path from the output contact to ground potential;
- a switch driver connected with a switch driver output contact via a gate resistance to a switch gate contact to change the switch into a connected state, where the voltage regulator is loaded with a variable drain-source resistance of the switch and the load resistor, and to change the switch into a disconnected state, where the voltage regulator is disconnected from the load resistor;
- a feedback resistor connected between the switch source contact and an inverted input contact of the switch driver.

BACKGROUND OF THE INVENTION

Voltage regulators are used to supply all kind of different devices like card readers, microprocessors, disc drivers or other type of integrated circuit with a constant voltage, which may only vary within a range depending on the specification of the device. Furthermore, the voltage regulator may need to supply different constant voltages depending on the power mode activated in the device. Ideally the voltage regulators output voltage is invariant during load transient, but in practice some variation is encountered, which becomes problematic, if allowable operating voltage tolerances of the device are exceeded. This mandates testing of the voltage regulators and its associated support components to verify desired performance under transient load conditions. Various methods are employable to generate transient loads allowing observation of the response of the voltage regulator. Test devices, like for instance the one of company Linear Technology type AN104F are used to test such voltage regulators.

FIG. 1 shows a principle block diagram of a system 1 of a voltage regulator 2 to be tested and a state of the art test device 3. The voltage regulator 2 is supplied with a regulator input supply voltage and provides at an output contact 4 a regulated voltage of e.g. 5 V. A FET driver is used as a switch 5, connected with its drain contact to the output contact 4 and its source contact to ground potential, wherein a load resistance 6 is arranged within this path between the output contact 4 and the drain contact. A test signal with different pulses is applied to a switch driver 7 realized by an integrated circuit LTC1693-1, which is connected to a gate contact of the switch 5. Depending on the signal form and frequency of the test signal, switch 5 switches or is changed between a disconnected state into a connected state, while in the connected state the transient resistance of the drain-source path may vary depending on the amplitude of the test signal at the gate contact. The overall series resistance of the drain-source resistance and the resistance of the load resistance 6 forms the transient load of the test device 3 for voltage regulator 2. An oscilloscope is connected at CH1 to output contact 4 of the voltage regulator 2, to display and measure the variations of the regulated voltage depending on the transient load of the test device 3 steered by the test signal. Via a "clip-on" wideband probe the current in the path of the transient load is measured at CH2.

When a user of system 1 starts the test, several factors influence the test result. The test device 3 connected at voltage regulator 2 output contact 4 acts as load with lots of variable to insert the variation/distortion like PCB traces, wire connection, discrete components (R, L, C), components parasitic, voltage regulator 2 itself, vias, capacitor mounting, voltage regulator 2 mounting, PCB power and ground planes. Similarly the switch driver 7 is also having a variation. The transmit side and received side variation gives the unexpected result at voltage regulator output contact 4. Another challenge with high speed design is to identification of the anti-resonance range, plane impedance, and plane resonance of power delivery used with the voltage regulator 2. As a result of all these variations a user of system 1 manually has to change the form and frequency of the test signal to measure how the voltage regulator 2 reacts on the transient load of the test device 3. This process takes several rounds of measurement to adjust the test signal, oscilloscope, offsets, triggers levels and correct timing setting to see the voltage pulse on oscilloscope, which makes the measurement cumbersome.

SUMMARY OF THE INVENTION

It is an object of the invention to provide a test device that has full control of all these parameters and influence factors to enable an automation this test procedure.

This object is achieved with a test device according to claim 1. Based on the inventive concept several feedback loops take care of all these influence factors to enable an automation of the test procedure. A current adjustment feedback driver is connected to the switch source contact to provide an analog current adjustment feedback signal or digital current adjustment feedback data for the test signal source to adjust the amplitude of the first test signal until a preset test current at the output contact of the voltage regulator is achieved. This comprises the advantage that if the test procedure provides the definition that preset test current consumption of the test device should be e.g. 2 A, test device will generate the voltage level of the test signal automatically to ensure the preset test current is achieved.

In a preferred embodiment, a discharge stage is connected to the output contact of the voltage regulator and built to discharge load of an output capacity of the voltage regulator at its output contact at the beginning of the test. The load status of this output capacity of the voltage regulator would influence the test result and this automated discharging before the test procedure is started ensures that test results are correct even at the start of the test procedure.

These and other aspects of the invention will be apparent from and elucidated with reference to the embodiments described hereinafter. The person skilled in the art will understand that various embodiments may be combined.

DETAILED DESCRIPTION OF EMBODIMENTS

Figure 1:
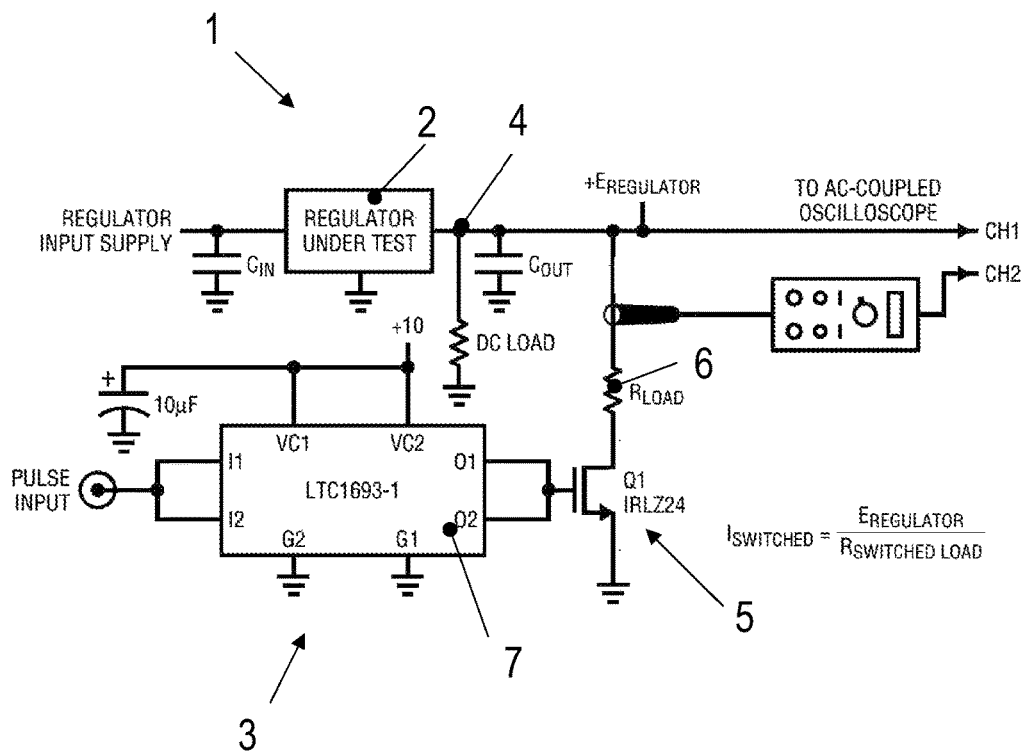
FIG. 1 shows a test device according to the state of the art.
Figure 2:
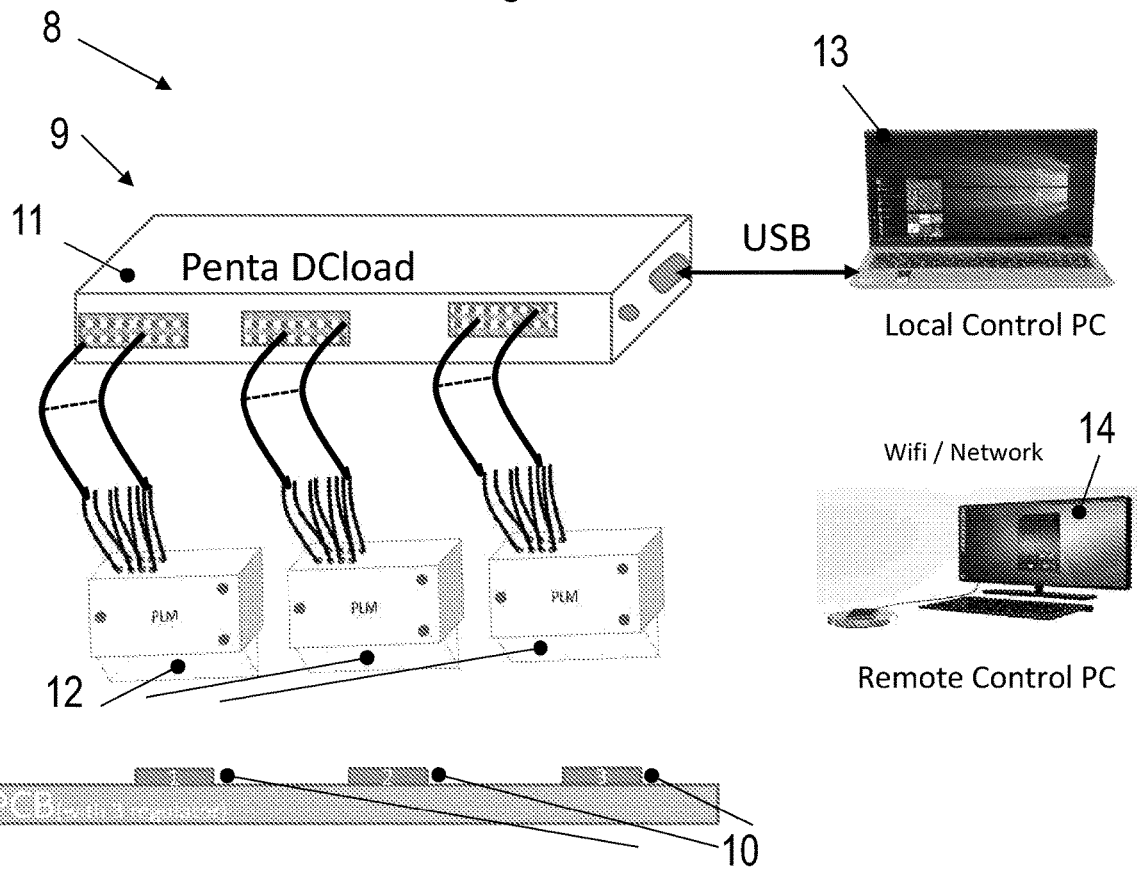
FIG. 2 shows a system of a test device according to a preferred embodiment of the invention.

FIG. 2 shows a system 8 of a test device 9 for testing the invariability of the output voltage of a voltage regulator 10 with transient loads. Test device 9 comprises a Penta DC load 11 as main device and a number of three pluggable load modules 12 as configurable or addable/replaceable parts to form the transient load. Voltage regulator 10 is connected like soldered or plugged to the pluggable load modules 12. System 8 furthermore comprises a local computer 13 connected via an USB cable and a remote compute 14. Local computer 13 could be connected with any other wire- or wireless technology and is used to define preset data for a test procedure of the test device 9 to test voltage regulator 10 and to display measurement results of the test. To enable that, local computer 13 runs a software to communicate with the test device 9 and to process for instance a oscilloscope software to show time and frequency diagrams of test signals as input or result signals of the test. In addition test or feedback data are displayed at the local computer 13. Remote computer 14 could be connected to the Internet or any other data net and receive and send data from test device 9 or local computer 13. Remote computer 14 may be used to enable a remote test of voltage regulator 10 as such tests may be processed over several days an remote tests provide advantages for the person that performs the test procedures.

Figure 3:
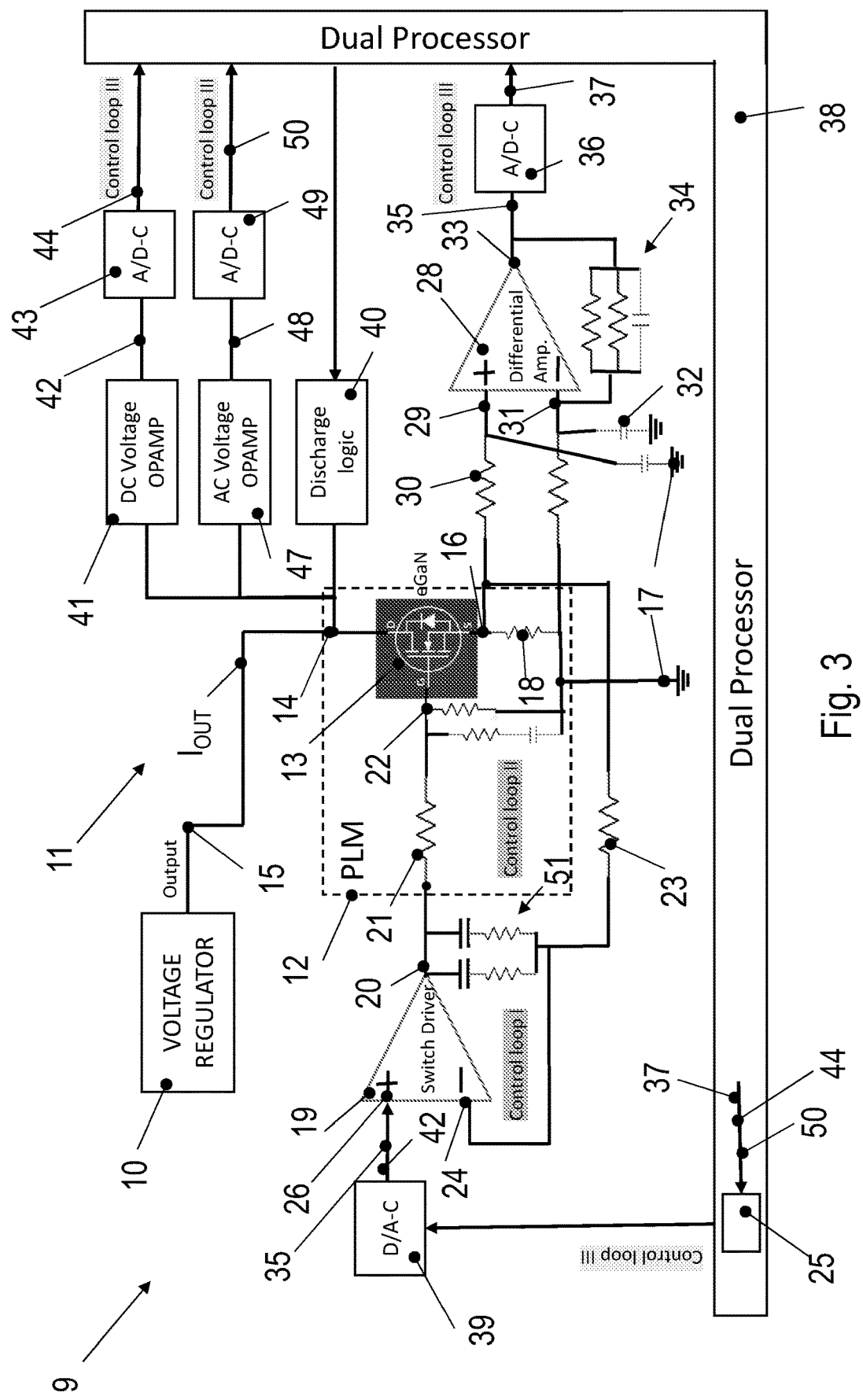
FIG. 3 shows electrical and functional blocks of the test device of the system in FIG. 2.

FIG. 3 shows electrical and functional blocks of the test device 9 of the system 8 shown in FIG. 2. Penta DC load 11 is shown with one of the pluggable load module 12 as an example. Test device 9 comprises a switch 13 connected with a switch drain contact 14 to an output contact 15 of the voltage regulator 10 and with a switch source contact 16 to ground potential 17, wherein a load resistance 18 is arranged within this path from the output contact 15 to ground potential 17. This means that the switch source contact 16 is not directly connected to ground potential 17, but connected via load resistor 18 to ground potential 17 in this embodiment shown in FIG. 3. In another embodiment of the invention load resistance 18 could be realized between output contact 15 and the switch drain contact 14 as well. Switch 13 is realized as GaN, but could be realized as SiC, IGBT, MosFet or FET as well. A person skilled in the art will be aware of other technologies to realize such a switch 13.

Penta DC load 11 of test device 9 furthermore comprises a switch driver 19 connected with a switch driver output contact 20 via a gate resistance 21 to a switch gate contact 22 to change the switch 13 into a connected state, where the voltage regulator 10 is loaded with a variable drain-source resistance of the switch 13 and the load resistor 18, and to change the switch 13 into a disconnected state, where the voltage regulator 10 is disconnected from the load resistor 18 and ground potential 17. Penta DC load 11 comprises such a switch driver 19 for each of the pluggable load modules 12 that may be connected to the Penta DC load 11.

Figure 4:
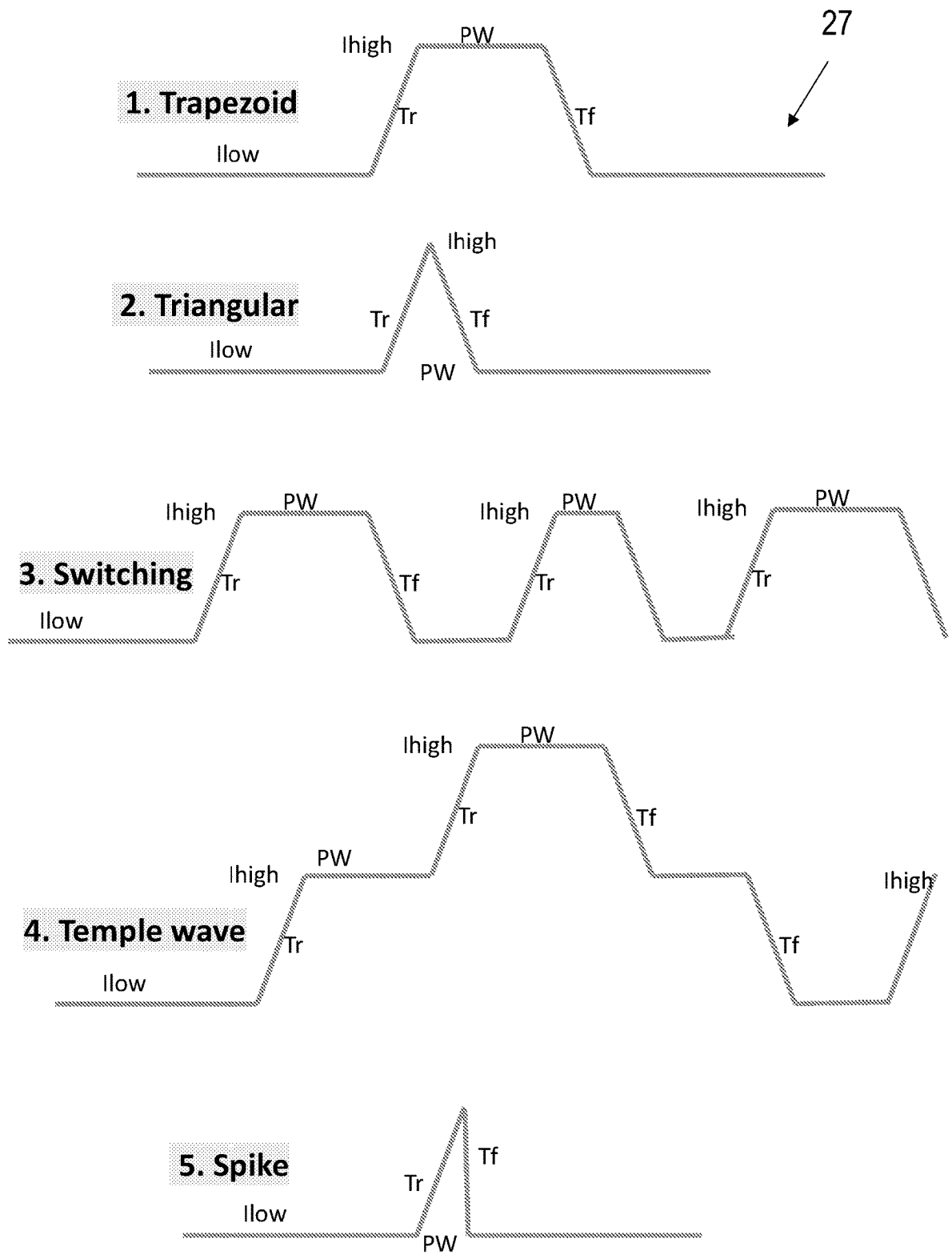
FIG. 4 shows examples of different test signals provided by test signal source of FIG. 3.

Penta DC load 11 of test device 9 furthermore comprises a feedback resistor 23 connected between the switch source contact 16 and an inverted input contact 24 of the switch driver 19. Furthermore a test signal source 25 of Penta DC load 11 is connected via a D/A Converter 39 to a direct input contact 26 of the switch driver 19 to provide at least a first test signal 27 with a particular test signal form and frequency for changing the switch 13 between its connected an disconnected state and for varying the variable drain-source resistance of the switch 13. FIG. 4 shows five different examples of test signals 27. During a test procedure to test all kind of different behaviors of voltage regulator 10 several different test signals 27 are used.

Penta DC load 11 comprises a Control loop II that is formed by the path from switch driver output contact 20 via gate resistance 21 and switch gate contact 22 and switch source contact 16 and feedback resistor 23 that provides a feedback voltage to inverted input contact 24. This feedback voltage is proportional to an output current $I_{OUT}$ at the output contact 15 of the voltage regulator 10, which output current passes through load resistance 18. This feedback voltage at the inverted input contact 24 stabilizes the output current $I_{OUT}$ at the output contact 15. This means that an input voltage is directly proportional and produces an almost same output current $I_{OUT}$ despite changes in open loop gain or switching element resistance. Therefore the output current $I_{OUT}$ at the output contact 15 is independent of the value/mode of switch 13. For instance, once the Control loop II is established and voltage gain reduces (due to OPAMP or any other factors), then output current $I_{OUT}$ tries to decrease. This result is less feedback voltage and more error voltage (difference between the Inverting and NI input of OPAMP). The increased error voltage almost completely offsets the decrease in voltage gain, so that the output current $I_{OUT}$ remains and follows the NI input.

Penta DC load 11 of test device 9 furthermore comprises a current adjustment feedback driver 28 connected with a direct input contact 29 via an input resistor 30 to the switch source contact 16 and connected with an inverted input contact 31 via a capacity 32 to ground contact 17. The current adjustment feedback driver 28 is furthermore connected with a current adjustment feedback driver output contact 33 via a compensator impedance 34 to the inverted input contact 31 of the current adjustment feedback driver 28 to provide on the current adjustment feedback driver output contact 33 a current adjustment feedback signal 35. An A/D Converter 36 is realized to convert the analogue current adjustment feedback signal 35 into current adjustment feedback data 37. Penta DC load 11 of test device 9 furthermore comprises a microprocessor 38 that realizes the test signal source 25 in the digital area and that processes such data to adjust the amplitude of the first test signal 27 until a preset test output current $I_{OUT}$ at the output contact 15 of the voltage regulator 10 is achieved and to provide these current adjustment feedback data 37 to the D/A Converter 39 that converts the current adjustment feedback data 37 back into the current adjustment feedback signal 35 for the switch driver 19. This feedback of the voltage at load resistance 18 via current adjustment feedback driver 28 and microprocessor 38 to its test signal source 25 is a first part of a Control loop III that avoids the need for manual adjustment of the amplitude current adjustment feedback signal 35 as input signal of the switch driver 19 or the manual adjustment of the amplitude of the test signal 27 by a person that processes the test. While Differential Amplifier is monitoring the current consumption in reality across the shunt resistor against the set value on GUI. If there is mismatch, processor will take following actions: The switching element is operating in their linear regions as variable resistors. The adjustment of the gate voltage permits to control the value of the resistance between drain and source, thereby setting the load current (output current $I_{OUT}$). DAC will vary the voltage level input to compensate the mismatch. Concurrently pluggable load module 12 monitors the voltage regulator 10 DC voltage level against the input provided by User (on GUI). Pluggable load module 12 also checks the AC level of the voltage regulator 10 and highlight to user about the dispensed. Pluggable load module 12 enables the Discharge logic to remove the floating charges and then checks again the AC level. If problem persist then user is updated with problem on GUI.

Penta DC load 11 of test device 9 furthermore comprises a discharge stage 40 connected to the output contact 15 of the voltage regulator 10 and built to discharge load of an output capacity of the voltage regulator 10 at its output contact 15 at the beginning of the test procedure. As every voltage regulator 10 is having charge leftover when the voltage regulator 10 is switched off, this residual power slowly discharges through available circuit connected at the output contact 15 of the voltage regulator 10 what may take 1 μs or 10 sec and depends upon circuit to circuit. Penta DC load 11 uses discharge stage 40 to discharge the output residual charge to zero by connecting the output contact 15 of the voltage regulator 10 to ground potential 17 using the digital control signal from microprocessor 38.

The test signal source 25 is furthermore built to provide a second test signal to simulate within this path from the output contact 15 to ground potential 17 the load for the voltage regulator 10 that causes the voltage regulator 10 to change between different switching modes including at least one power save mode and an active or full power mode. A person skilled in the art knows other switching modes of voltage regulator 10 like hibernating mode, sleep mode, power saving mode, passive mode, active mode, full power mode. Based on mode to test, test device 9 will change the test signal source 25 from one state to another state by varying the amplitude or test signal 27 of the test signal source 25. This change in driver signal should not change the DC voltage level at output contact 15. The test device 9 comprises an DC voltage stage 41 connected to the output contact 15 of the voltage regulator 10 and built to provide at an DC voltage stage output contact a voltage change feedback signal 42 for the test signal source 25 to confirm compliance with the change between the at least one power save mode and the active or full power mode in response to the second test signal. To process and provide the voltage change feedback signal 42 to the test signal source 25, an A/D Converter 43 is realized to convert the analogue voltage change feedback signal 42 into digital voltage change feedback data 44 and, after processing these digital voltage change feedback data 44 with the test signal source 25, a D/A Converter 39 is used to convert the digital voltage change feedback data 44 back into the analogue voltage change feedback signal 42 for the switch driver 19.

Figure 5:
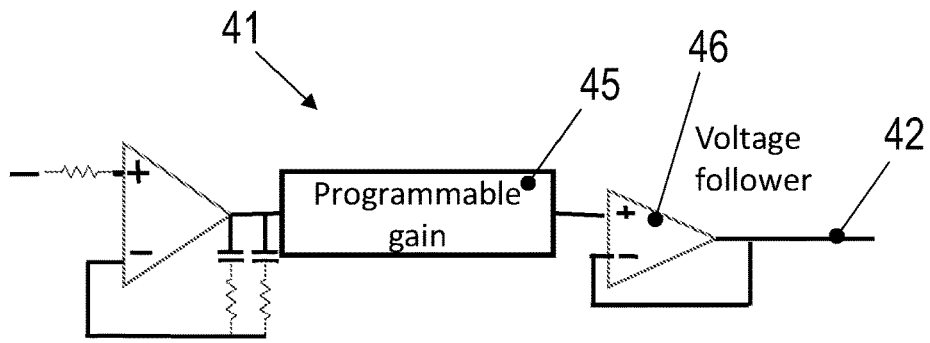
FIG. 5 shows one example how the DC voltage stage of the test device could be realized.

FIG. 5 shows one example how the DC voltage stage 41 could be realized. DC voltage stage 41 comprises a compensation type 2 network, which is an Operational amplifier with a feedback loop to the inverted input with at least one series line of a capacity and an ohmic resistance. The output contact of the Operational amplifier is connected to an input contact of a programmable gain controller 45, which is connected with its output contact to a direct input contact of a voltage follower stage 46, which provides at its output contact the voltage change feedback signal 42, which is fed to the A/D converter 43 to provide the voltage change feedback data 44 for the test signal source 25.

During the test procedure Penta DC load 11 varies the load required at the output contact 15 of the voltage regulator 10 to switch the modes. Simultaneously Penta DC load 11 checks the voltage output and confirms that different modes are operating as expected without user controlling the manually the load for the voltage regulator 10. Penta DC load 11 is also having provision to check the debug pins of the voltage regulator 10 to check the status of logic based on modes. Voltage change feedback data 44 from DC voltage stage 41 are part of Control loop III of Penta DC load 11.

Test signal source 25 is furthermore built to provide a third test signal to simulate the load for the voltage regulator 10 that causes the voltage regulator 10 to change between the disconnected state of the switch 13 to connected state of the switch 13 with minimal variable drain-source resistance of the switch 13 and the load resistor 18. Test device 9 furthermore comprises an AC voltage stage 47 connected to the output contact 15 of the voltage regulator 10 and built to provide at an AC voltage stage output contact a load change feedback signal 48 for the test signal source 25 to confirm compliance with the change between the maximal load change in response to the third test signal. To process and provide the load change feedback signal 48 to the test signal source 25, an A/D Converter 49 is realized to convert the analogue load change feedback signal 48 into digital load change feedback data 50 and D/A Converter 39 is used to convert the digital load change feedback data 50 back into the analogue load change feedback signal 48.

Figure 6:
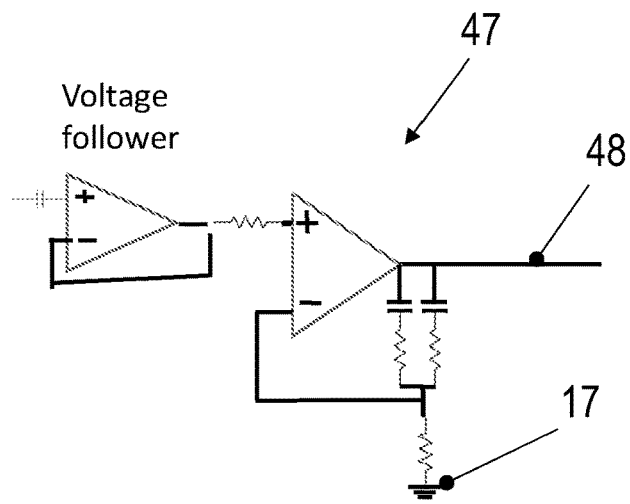
FIG. 6 shows one example how the AC voltage stage of the test device could be realized.
Figure 7:
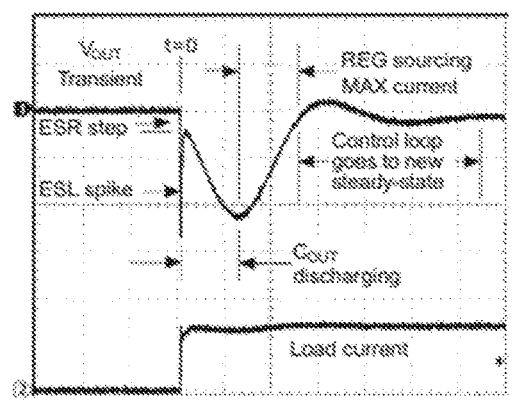
FIG. 7 shows a voltage transient response.

FIG. 6 shows one example how the AC voltage stage 47 could be realized. IQ is the no-load quiescent current, and the most important bottleneck to overcome for duty cycled low-power systems. Low IQ enables longer battery life. In many application, minimizing quiescent current (IQ) is a key factor to reduce power consumption and manage battery life. However, Power-supply (voltage regulator 10) accuracy is often limited by its transient response. Basically the period where the converter is powered down, all unnecessary internal circuitry is turned off to reduce the IC's quiescent current. Low-IQ devices suffer from longer response times because the internal parasitic capacitors need to be charged to new operating points with relatively less current. The worst case is usually a step from no load to the maximum allowed load current. Such cases necessitate reactivating circuits that had been deactivated or reduced in power, causing an additional delay. Using pluggable load module 12, user can find out the response time of Low IQ of the voltage regulator 10. Where DAC drives the fast transient when voltage regulator 10 is in low IQ mode. Using the AC measurement in control loop III, pluggable load module 12 can measure the when the pulse is visible and how long as can be seen in FIG. 7. The response time comprises three stages: a delay time to react to the change, a recovery time from a dip or overshoot, and a settling time.

Test device 9 furthermore comprises an oscillation damping feedback loop impedance 51 connected between the switch driver output contact 20 and the inverted input contact 24 of the switch driver 19, which oscillation damping feedback loop impedance 51 comprises at least one capacity and ohmic resistance connected in series to damp oscillations caused by an input capacity of the switch gate contact 22 to avoid unwanted switching of the switch 13. This damping feedback loop impedance 51 enables a Control loop I of the test device 9.

Microprocessor 38 of test device 9 furthermore is configured to generate a switch signal or switch data for the voltage regulator 10 to change the mode of the voltage regulator 10 into an off state before running the test procedure to confirm that the voltage change feedback signal 42 or voltage change feedback data 44 from the DC voltage stage 41 indicate that the output voltage at the output contact 15 of the voltage regulator 10 is zero Volt.

Microprocessor 38 of test device 9 furthermore is configured to generate a switch signal or switch data for the voltage regulator 10 to change the mode of the voltage regulator 10 into an on state before running the test procedure to confirm that the current change feedback signal 48 or current change feedback data 50 from the AC voltage stage 47 indicate that no external noise is on the output contact 15 of the voltage regulator 10.

In another embodiment of the invention, test signal source 25 could be realized in the analogue area to provide the analogue first test signal directly to the direct input contact 26 of the switch driver 19 without the need of the D/A Converter.

The invention claimed is:

1. A test device for testing the invariability of the output voltage of a voltage regulator with transient loads, which test device comprises:
   a switch connected with a switch drain contact to an output contact of the voltage regulator and with a switch source contact to ground potential, wherein a load resistance is arranged within this path from the output contact to ground potential;
   a switch driver connected with a switch driver output contact via a gate resistance to a switch gate contact to change the switch into a connected state, where the voltage regulator is loaded with a variable drain-source resistance of the switch and the load resistor, and to change the switch into a disconnected state, where the voltage regulator is disconnected from the load resistor;
   a feedback resistor connected between the switch source contact and an inverted input contact of the switch driver;
   a test signal source connected directly or via a D/A (digital-to-analog) converter to a direct input contact of the switch driver to provide at least a first test signal with a particular test signal form and frequency for changing the switch and varying the variable drain-source resistance of the switch; and
   a current adjustment feedback driver connected with a direct input contact via an input resistor to the switch source contact and connected with an inverted input contact via a capacity to a ground contact and connected with a current adjustment feedback driver output contact via a compensator impedance to the inverted input contact of the current adjustment feedback driver to provide on the current adjustment feedback driver output contact a current adjustment feedback signal or current adjustment feedback data for the test signal source to adjust the amplitude of the first test signal until a preset test current at the output contact of the voltage regulator is achieved.

2. The test device according to claim 1, further comprising a discharge stage connected to the output contact of the voltage regulator and operable to discharge load of an output capacity of the voltage regulator at its output contact at the beginning of the test.

3. The test device according to claim 1, which test signal source is operable to provide a second test signal to simulate the load for the voltage regulator that causes the voltage regulator to change between different switching modes including at least one power save mode and an active or full power mode and which test device furthermore comprises a DC voltage stage connected to the output contact of the voltage regulator and operable to provide at an DC voltage stage output contact a voltage change feedback signal or voltage change feedback data for the test signal source to confirm compliance with the change between the at least one power save mode and the active or full power mode in response to the second test signal.

4. The test device according to claim 3, wherein the DC voltage stage comprises a compensation type 2 network with an output contact connected to an input contact of a programmable gain controller, which is connected with its output contact to a direct input contact of a voltage follower stage, which provides at its output contact the voltage change feedback signal, which is fed to an A/D converter to provide the voltage change feedback data for the test signal source.

5. The test device according to claim 1, wherein the test signal source is operable to provide a third test signal to simulate the load for the voltage regulator that causes the voltage regulator to change between the disconnected state of the switch to connected state of the switch with minimal variable drain-source resistance of the switch and the load resistor and the test device further comprising an AC voltage stage connected to the output contact of the voltage regulator and operable to provide at an AC voltage stage output contact a load change feedback signal or load change feedback data for the test signal source to confirm compliance with the change between the maximal load change in response to the third test signal.

6. The test device according to claim 1, further comprising an oscillation damping feedback loop impedance connected between the switch driver output contact and the inverted input contact of the switch driver, which oscillation damping feedback loop impedance comprises at least one capacity and ohmic resistance connected in series to damp oscillations caused by an input capacity of the switch gate contact to avoid unwanted switching of the switch (Control loop I).

7. The test device according to claim 1, wherein the switch is connected with its switch source contact via resistor to the switch driver inverted input contact (Control loop II).

8. The test device according to claim 3, further comprising a controller configured to generate a switch signal or switch data for the voltage regulator to change the mode of the voltage regulator into an off state before running the test to confirm that the voltage change feedback signal or voltage change feedback data from the DC voltage stage indicate that the output voltage at the output contact of the voltage regulator is zero volt.

9. The test device according to claim 8, wherein the controller is operable to generate a switch signal or switch data for the voltage regulator to change the mode of the voltage regulator into an on state before running the test to confirm that the voltage change feedback signal or voltage change feedback data from the DC voltage stage indicate that the output voltage at the output contact of the voltage regulator matches the voltage preset for this test.

10. The test device according to claim 5, further comprising a controller operable to generate a switch signal or switch data for the voltage regulator to change the mode of the voltage regulator into an on state before running the test to confirm that the load change feedback signal or load change feedback data from the AC voltage stage indicate that no external noise is on the output contact of the voltage regulator.

11. A system comprising:
   the test device according to claim 1; and
   a computer operable to run a software to communicate with the test signal source of the test device and to display any of the following signals or data: first test signal; second test signal; third test signal; current adjustment feedback signal; current adjustment feedback data; voltage change feedback signal; voltage change feedback data; load change feedback signal; load change feedback data.

12. The test device according to claim 2, wherein the test signal source is operable to provide a second test signal to simulate the load for the voltage regulator that causes the voltage regulator to change between different switching modes including at least one power save mode and an active or full power mode, and the test device further comprises an DC voltage stage connected to the output contact of the voltage regulator and operable to provide at a DC voltage stage output contact a voltage change feedback signal or voltage change feedback data for the test signal source to confirm compliance with the change between the at least one power save mode and the active or full power mode in response to the second test signal.

13. The test device according to claim 2, wherein the test signal source is operable to provide a third test signal to simulate the load for the voltage regulator that causes the voltage regulator to change between the disconnected state of the switch to connected state of the switch with minimal variable drain-source resistance of the switch and the load resistor and the test device further comprises an AC voltage stage connected to the output contact of the voltage regulator and operable to provide at an AC voltage stage output contact a load change feedback signal or load change feedback data for the test signal source to confirm compliance with the change between the maximal load change in response to the third test signal.

14. The test device according to claim 3, wherein the test signal source is operable to provide a third test signal to simulate the load for the voltage regulator that causes the voltage regulator to change between the disconnected state of the switch to connected state of the switch with minimal variable drain-source resistance of the switch and the load resistor and which test device furthermore comprises an AC voltage stage connected to the output contact of the voltage regulator and built to provide at an AC voltage stage output contact a load change feedback signal or load change feedback data for the test signal source to confirm compliance with the change between the maximal load change in response to the third test signal.

15. The test device according to claim 4, wherein the test signal source is operable to provide a third test signal to simulate the load for the voltage regulator that causes the voltage regulator to change between the disconnected state of the switch to connected state of the switch with minimal variable drain-source resistance of the switch and the load resistor and which test device furthermore comprises an AC voltage stage connected to the output contact of the voltage regulator and built to provide at an AC voltage stage output contact a load change feedback signal or load change feedback data for the test signal source to confirm compliance with the change between the maximal load change in response to the third test signal.

16. The test device according to claim 2, further comprising an oscillation damping feedback loop impedance connected between the switch driver output contact and the inverted input contact of the switch driver, and the oscillation damping feedback loop impedance comprises at least one capacity and ohmic resistance connected in series to damp oscillations caused by an input capacity of the switch gate contact to avoid unwanted switching of the switch (Control loop I).

17. The test device according to claim 3, further comprising an oscillation damping feedback loop impedance connected between the switch driver output contact and the inverted input contact of the switch driver, and the oscillation damping feedback loop impedance comprises at least one capacity and ohmic resistance connected in series to damp oscillations caused by an input capacity of the switch gate contact to avoid unwanted switching of the switch (Control loop I).

18. The test device according to claim 4, which furthermore comprises an oscillation damping feedback loop impedance connected between the switch driver output contact and the inverted input contact of the switch driver, and the oscillation damping feedback loop impedance comprises at least one capacity and ohmic resistance connected in series to damp oscillations caused by an input capacity of the switch gate contact to avoid unwanted switching of the switch (Control loop I).

* * * * *